METHOD OF PRODUCING TRANSISTOR DEVICES

Filed Sept. 30, 1959 2 Sheets-Sheet 1

Inventor.
Gábor Faskerty.
By. [signature] Atty.

April 24, 1962 G. FASKERTY 3,030,693

METHOD OF PRODUCING TRANSISTOR DEVICES

Filed Sept. 30, 1959 2 Sheets-Sheet 2

Inventor.
Gábor Faskerty.
By. [signature] Atty.

United States Patent Office 3,030,693
Patented Apr. 24, 1962

3,030,693

METHOD OF PRODUCING TRANSISTOR DEVICES

Gábor Faskerty, Munich, Germany, assignor to Siemens & Halske Aktiengesellschaft Berlin and Munich, a corporation of Germany Filed Sept. 30, 1959, Ser. No. 843,411
Claims priority, application Germany Oct. 15, 1958
6 Claims. (Cl. 29—25.3)

Figure 1:
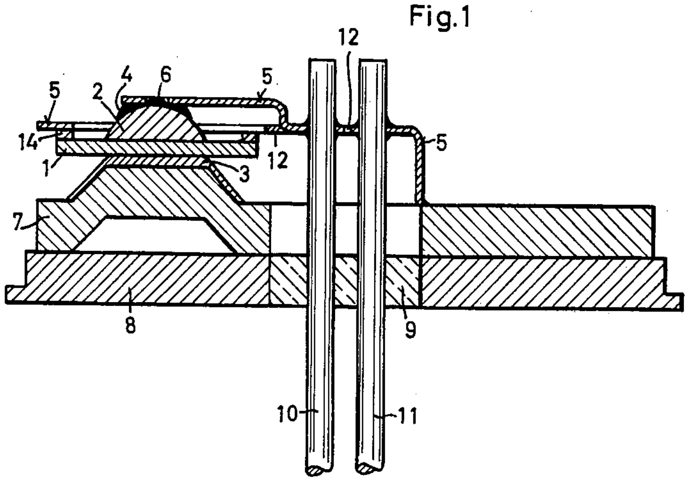

This invention relates to semiconductor devices and is particularly concerned with a transistor device having a sealed-in system including a semiconductor body provided with a base electrode and emitter and collector electrodes preferably alloyed thereto.

Electrode systems of prior transistors were constructed by heating alloying pills to a temperature below the alloying temperature so as to cement them to a semiconductor body while the actual alloying-in was effected during the contacting of the electrodes. The alloying fronts formed in this manner are not always satisfactory and the corresponding systems also exhibit considerable straying with regard to electrical values.

Other prior methods contemplate formation of the electrode system with final electrical values and soldering of such system upon a base plate. The emitter and base connections are subsequently contacted by means of soldering tabs and the like. A favorable heat conduction is difficult to achieve in this manner and automatization is likewise rendered difficult.

The present invention proposes to overcome these and other drawbacks by the provision of an improved method and construction of the electrode system and the terminal system of transistors.

In accordance with the invention, the electrode system comprising a semiconductor body provided with a base electrode and emitter and collector electrodes preferably alloyed thereto, is mechanically mounted upon a terminal arrangement comprising a base plate lead-in terminal means for the various electrodes extending through such base plate, and intermediate current leads being provided for metallically connecting the respective lead-in terminals with the electrodes of the system. In order to obtain good heat conductivity, which is particularly important in connection with the collector of alloyed transistors, the electrode system is mounted on a system carrier made of good heat conducting material, for example, copper, with the collector soldered to the carrier over a large area thereof.

The invention contemplates alloying into a preferably circular disk shaped semiconductor wafer made, for example, of germanium, alloying pills, for example, indium, to operate respectively as emitter and as collector. The recrystallization zone forming upon cooling exhibits a conductivity type opposite to that of the semiconductor wafer. A preferably annular or ring shaped base electrode made of a metal with the same conduction type as the semiconductor wafer can be alloyed to such wafer at the same time. The collector electrode of this finally alloyed electrode system is placed upon a dome shaped part of a metallic system carrier which part is, for example, coated with gold and mounted on a metallic base plate provided with lead-in terminal members. A sheet metal template which is made of one piece and the shape of which is adapted to the arrangement of the parts of the electrode system, is thereupon placed in position on these system parts, with the lead-in terminal conductors extending through holes formed in the template, parts of the template engaging the base electrode and the emitter electrode, respectively, thereby accurately determining the position of the template with respect to the transistor system. In a particularly favorable embodiment, the electrode system is clamped into the sheet metal template. The parts to be contacted, that is, the emitter electrode, the base electrode and, to obtain good wetting of the indium of the collector, also the dome shaped portion of the carrier on which the system is positioned, as well as the lead-in terminal conductors, are provided with soft solder. The entire assembly is now heated in a protective gas to about 250° C. to 350° C., that is, to a temperature lying below the temperature required for alloying the metal pill into the semiconductor but above the melting temperature of the metal pill. The liquid collector metal will flow about the dome shaped part of the system carrier. The collector electrode is in this manner connected with the system carrier over a large surface and with small spacing benefitting heat conduction at the collector. In order to obtain better wetting of the parts to be soldered together, it is advantageous to provide the dome shaped part of the system carrier with soft solder or with a metal promoting wetting, for example, indium or gold. The soft solder at the remaining areas will likewise melt and effect the corresponding soldering. The individual connections are after the cooling of the assembly electrically separated by cutting the metal sheet template at the corresponding areas. The temperatures applied in the soldering operation are relatively low and the previously produced alloying fronts therefore remain respectively unchanged or change only to a negligible degree that is not disturbing. The spacing between the system carrier and the semiconductor body can be kept very small and can be secured by the configuration of the template or, if desired, by the use of spacer means.

Figure 2:
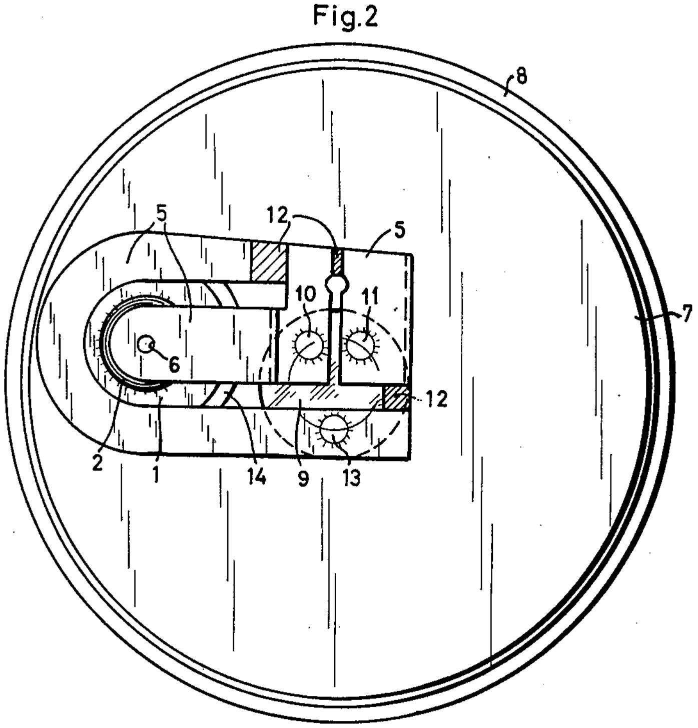
Figure 3:
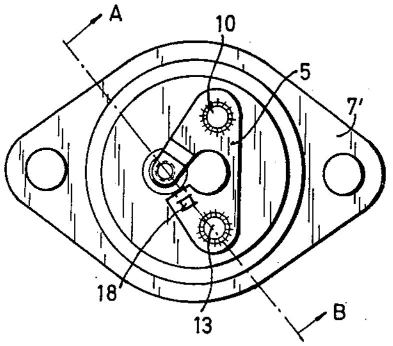
Figure 3A:
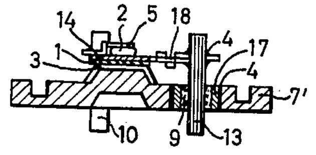

The invention will now be explained with reference to the accompanying drawings, in which:

FIG. 1 and 2 show one embodiment in part sectional view and in plan top elevational view, respectively; and FIGS. 3 and 3*a* show in similar representation another embodiment of the invention.

Referring now to FIGS. 1 and 2, numeral 8 indicates the base plate of the housing, made, for example, of iron and provided with a fused seal 9 of glass which is opaque to light, such seal carrying the lead-in terminal conductors in insulated relation with respect to the base plate of the housing. FIG. 1 shows only the collector lead-in terminal conductor 11 and the emitter lead-in terminal conductor 10, FIG. 2 also showing the base lead-in conductor 13. The system carrier 7 which is, for example, made of copper is cemented to the base plate 8 in electrically insulating but good heat conducting relationship, the base plate 8 serving heat conduction purposes. The system carrier 7 is advantageously provided with a dome shaped portion for receiving the finally alloyed system with its collector 3 in engagement therewith. Numeral 1 indicates the semiconductor body, for example, a circular germanium wafer, and numeral 2 indicates the emitter electrode which, for example, is made of indium, as is the collector electrode 3. The sheet metal template 5 consists of an integral piece and is coated, for example, with gold which promotes wetting. The template 5 is of a configuration with parts thereof engaging respectively the emitter electrode 2 and the base electrode 14. The template 5 is also provided with holes formed therein for receiving the lead-in terminal conductors 10, 11, 13. Another hole 6 formed in the upper branch of the template 5 is provided through which the soft solder 4 and the indium of the emitter electrode can wet the surface of the corresponding template branch and absorb surplus solder. The annular base member 14 and the lead-in terminal conductors 10, 11, 13 are provided with soft solder at the points of engagement with the template 5. As mentioned before, the entire assembly is heated to 250° C. to 350° C. so as to effect the soldering by the soft solder of the electrodes and the lead-in terminal conductors. The collector alloying metal, such as indium, becomes liquid and flows about the inclined surfaces of the dome shaped part to the plane part of the system carrier. The spacing between the collector surface and the system carrier is thus made very small and the heat conduction at the collector is increased. The heat conduction is moreover facilitated by the large area engagement between the collector and the system carrier. The minimum spacing between the semiconductor body 1 and the system carrier 7 can be secured, also as mentioned before, by the configuration of the template or by the use of spacer means. The parts indicated in FIG. 2 by numeral 12 are after the cooling of the assembly cut out from the template and the individual connections are thus mutually separated. The entire assembly is enclosed vacuumtight by means of a metal cap (not shown) which is welded to the base plate 8.

FIGS. 3 and 3*a* show a particularly advantageous embodiment of a high capacity transistor made in accordance with the invention. The generally oval shaped copper plate 7' also forms the base plate of the housing. The collector electrode 3 is electrically connected with this copper plate and the latter accordingly constitutes the collector terminal. The housing therefore has only two lead-in terminal conductors 10 and 13 for the emitter and for the base, respectively. These terminal conductors are surrounded by a fused glass seal 9 and an iron ring 17, provided with soft solder 4, and are during the contacting of the electrodes with the sheet metal template 5 vacuumtight soldered to the base plate 7'. The template 5 is of a configuration, such that the system comprising the emitter, collector and annular base member can be clamped therein. The annular base member is provided with an extension 18 which projects through the template 5 as shown in FIG. 3. The oval base plate with only two lead-in terminal conductors is particularly advantageous because it does not require a crowded arrangement of the system parts and of the lead-in conductors. The base plate 7' may also be provided, for example, with an evacuation nipple (not shown) which may also be utilized for introducing the protective gas into the housing and such nipple may be soldered to the assembly during the contacting operation.

The advantages resulting from the invention, as compared with previously known contacting methods, are as follows:

The electrode system can be completely and finally alloyed prior to its assembly in a housing, thus permitting the application of proved methods for the production of plane and well functioning alloying fronts. The contacting of the electrodes and of the lead-in terminal conductors as well as the soldering of the electrode system onto the system carrier can be effected simultaneously in a single operation. The spacing between the collector and the system carrier can be made very small and it is, accordingly, possible to produce arrangements with good heat conduction and, therefore, high capacity transistors. The method according to the invention is due to its simplicity vary well adapted for the automatization of the contacting operations.

It is within the scope of the invention possible to effect alloying-in of the base electrode during the contacting operation.

Changes may be made within the scope and spirit of the appended claims which define what is believed to be new and desired to have protected by Letters Patent.

I claim:

1. A method of producing a transistor device having the following parts, namely, a semiconductor system including a semiconductor body and electrodes alloyed thereto and including an emitter electrode and a collector electrode and a base electrode, and having a carrier member for said system which carrier member is made of copper or the like and includes a dome shaped portion and a base plate for said carrier, and having lead-in terminal conductors extending through said base plate, and also having intermediate conductor means for separately interconnecting said lead-in terminal conductors with the respective electrodes of said system; said method comprising taking an integral sheet metal template and mechanically and electrically firmly connecting parts of said template respectively with the emitter electrode and the base electrode of said system while firmly mechanically and electrically connecting the collector electrode of said system with the dome shaped portion of said carrier, and thereupon cutting out portions of said template so as to form said intermediate conductor means for electrically separately interconnecting said lead-in terminal conductors with the respective individual electrodes of said system.

2. A method according to claim 1, comprising providing the areas to be contacted with soft solder, and heating the assembly of parts in a protective gas to a temperature lying above the melting point of the alloying metal of said electrodes but below the alloying temperature thereof.

3. A method according to claim 2, comprising clamping said system between projections formed on said sheet metal template.

4. A method according to claim 3, wherein said carrier member is of generally oval shape and constitutes said base plate, comprising the steps of soldering said lead-in terminal conductors vacuumtight to said carrier member and base plate.

5. A method according to claim 4, comprising soldering an evacuating nipple to said carrier member and base plate.

6. A method according to claim 2, comprising effecting the alloying-in of said base electrode while effecting the interconnection of the named parts.

References Cited in the file of this patent

UNITED STATES PATENTS

| | | |
|---|---|---|
| 2,914,716 | Larrison | Nov. 24, 1959 |
| 2,916,604 | Doelp | Dec. 8, 1959 |
| 2,932,684 | Hales et al. | Apr. 12, 1960 |